(12) United States Patent
Jarvis et al.

(10) Patent No.: US 8,879,266 B2
(45) Date of Patent: Nov. 4, 2014

(54) THIN MULTI-LAYERED STRUCTURES PROVIDING RIGIDITY AND CONDUCTIVITY

(75) Inventors: Daniel W. Jarvis, Sunnyvale, CA (US); Richard Hung Minh Dinh, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 343 days.

(21) Appl. No.: 13/480,458

(22) Filed: May 24, 2012

(65) Prior Publication Data

US 2013/0314875 A1    Nov. 28, 2013

(51) Int. Cl.
*H05K 7/20* (2006.01)

(52) U.S. Cl.
USPC ........... 361/714; 361/715; 361/718; 361/720; 361/722; 29/832

(58) Field of Classification Search
CPC ....................................................... H05K 7/20
USPC ........... 361/679.46–679.54, 688–723, 679.56
See application file for complete search history.

(56) References Cited

U.S. PATENT DOCUMENTS

| | | |
|---|---|---|
| 2,647,079 A | 7/1953 | Burnham |
| 2,812,295 A | 11/1957 | Patrick |
| 2,990,304 A | 6/1961 | Cybriwsky et al. |
| 3,316,866 A | 5/1967 | Orlin |
| 3,526,694 A | 9/1970 | Lemelson |
| 3,645,777 A | 2/1972 | Sierad |
| 2,346,531 A | 1/1981 | Adachi et al. |
| 4,247,600 A | 1/1981 | Adachi |
| 4,269,947 A | 5/1981 | Inata et al. |
| 4,347,428 A | 8/1982 | Conrad et al. |
| 4,531,705 A | 7/1985 | Nakagawa et al. |
| 4,547,649 A | 10/1985 | Butt et al. |
| 4,564,001 A | 1/1986 | Maeda |
| 4,651,453 A | 3/1987 | Doyle |
| 4,686,352 A | 8/1987 | Nawrot et al. |
| 4,756,771 A | 7/1988 | Brodalla et al. |
| 2,989,325 A | 6/1990 | Mullaney |
| 4,931,366 A | 6/1990 | Mullaney |

(Continued)

FOREIGN PATENT DOCUMENTS

| | | |
|---|---|---|
| CN | 1362125 A | 8/2002 |
| CN | 1306526 C | 3/2007 |

(Continued)

OTHER PUBLICATIONS

Annerfors et al., "Nano Molding Technology on Cosmetic Aluminum Parts in Mobile Phones", Division of Production and Materials Engineering, LTH, 2007.

(Continued)

*Primary Examiner* — David M Sinclair
*Assistant Examiner* — Robert Brown

(57) ABSTRACT

Electronic devices having a multi-layer structure that provides enhanced conductivity (thermal and/or electrical conductivity) are disclosed. The multi-layer structure can have a plurality of adjacent layers. At least one layer can primarily provide structural rigidity, and at least another layer can primarily provide enhanced conductivity. The layer of high conductivity can serve to provide the electronic device with greater ability to disperse generated heat and/or to provide an accessible voltage potential (e.g., ground plane). Advantageously, the multi-layer structure can provide enhanced conductivity using an otherwise required structural component and without necessitating an increase in thickness.

32 Claims, 9 Drawing Sheets

(56) References Cited

U.S. PATENT DOCUMENTS

| | | | |
|---|---|---|---|
| 4,993,148 A | 2/1991 | Adachi et al. | |
| 5,215,864 A | 6/1993 | Laakmann | |
| 5,224,197 A | 6/1993 | Zanoni et al. | |
| 5,288,344 A | 2/1994 | Peker et al. | |
| 5,417,905 A | 5/1995 | Lemaire et al. | |
| 5,540,867 A | 7/1996 | DeBello | |
| 5,645,964 A | 7/1997 | Nohr et al. | |
| 5,719,379 A | 2/1998 | Huang et al. | |
| 5,789,466 A | 8/1998 | Birmingham et al. | |
| 5,808,268 A | 9/1998 | Balz et al. | |
| 5,835,350 A * | 11/1998 | Stevens | 361/704 |
| 5,837,086 A | 11/1998 | Leeb et al. | |
| 5,872,699 A | 2/1999 | Nishii et al. | |
| 5,925,847 A | 7/1999 | Rademacher et al. | |
| 5,943,799 A | 8/1999 | Xu et al. | |
| 6,007,929 A | 12/1999 | Robertson et al. | |
| 6,075,701 A * | 6/2000 | Ali et al. | 361/704 |
| 6,101,372 A | 8/2000 | Kubo | |
| 6,169,266 B1 | 1/2001 | Hughes | |
| 6,325,868 B1 | 12/2001 | Kim et al. | |
| 6,331,239 B1 | 12/2001 | Shirota et al. | |
| 6,351,374 B1 * | 2/2002 | Sherry | 361/679.33 |
| 6,400,571 B1 * | 6/2002 | Kimura et al. | 361/704 |
| 6,480,397 B1 | 11/2002 | Hsu et al. | |
| 6,574,096 B1 | 6/2003 | Difonzo et al. | |
| 6,590,183 B1 | 7/2003 | Yeo | |
| 6,624,432 B1 * | 9/2003 | Gabower et al. | 250/515.1 |
| 6,633,019 B1 | 10/2003 | Gray | |
| 6,746,724 B1 | 6/2004 | Robertson et al. | |
| 6,802,952 B2 | 10/2004 | Hsu | |
| 6,821,305 B2 | 11/2004 | Yan | |
| 6,966,133 B2 | 11/2005 | Krings et al. | |
| 6,996,425 B2 | 2/2006 | Watanabe | |
| 7,134,198 B2 * | 11/2006 | Nakatani et al. | 29/841 |
| 7,181,172 B2 | 2/2007 | Sullivan et al. | |
| 7,225,529 B2 | 6/2007 | Wang | |
| 7,284,396 B2 | 10/2007 | Barron et al. | |
| 7,459,373 B2 | 12/2008 | Yoo | |
| 7,508,644 B2 | 3/2009 | Cheung et al. | |
| 7,622,183 B2 * | 11/2009 | Shirai et al. | 428/209 |
| 7,636,974 B2 | 12/2009 | Meschter et al. | |
| 7,691,189 B2 * | 4/2010 | En et al. | 106/1.23 |
| 7,933,126 B2 * | 4/2011 | Jain | 361/704 |
| 7,965,514 B2 * | 6/2011 | Hill et al. | 361/707 |
| 7,969,739 B2 * | 6/2011 | Tsunoda et al. | 361/704 |
| 8,192,815 B2 | 6/2012 | Weber et al. | |
| 8,264,820 B2 * | 9/2012 | Zadesky et al. | 361/679.01 |
| 8,367,304 B2 | 2/2013 | Heley et al. | |
| 8,379,678 B2 | 2/2013 | Zhang et al. | |
| 8,379,679 B2 | 2/2013 | Zhang et al. | |
| 8,391,010 B2 * | 3/2013 | Rothkopf et al. | 361/708 |
| 8,432,696 B2 * | 4/2013 | Ribas et al. | 361/714 |
| 8,451,873 B2 | 5/2013 | Zhang | |
| 8,576,561 B2 * | 11/2013 | Myers et al. | 361/679.56 |
| 8,598,700 B2 * | 12/2013 | Gu et al. | 257/706 |
| 8,650,886 B2 * | 2/2014 | Wilcoxon et al. | 62/3.2 |
| 8,663,806 B2 | 3/2014 | Weber et al. | |
| 8,731,618 B2 * | 5/2014 | Jarvis et al. | 455/566 |
| 2001/0030002 A1 | 10/2001 | Zheng et al. | |
| 2002/0058737 A1 | 5/2002 | Nishiwaki et al. | |
| 2002/0097440 A1 | 7/2002 | Paricio | |
| 2002/0109134 A1 | 8/2002 | Iwasaki et al. | |
| 2002/0130441 A1 | 9/2002 | Robinson et al. | |
| 2002/0160145 A1 | 10/2002 | Bauhoff | |
| 2003/0006217 A1 | 1/2003 | Dance | |
| 2003/0024898 A1 | 2/2003 | Natsume et al. | |
| 2003/0074814 A1 | 4/2003 | Krings et al. | |
| 2004/0000490 A1 | 1/2004 | Chang | |
| 2004/0029001 A1 | 2/2004 | Yamazaki et al. | 429/176 |
| 2004/0125564 A1 * | 7/2004 | DiStefano et al. | 361/704 |
| 2005/0023022 A1 | 2/2005 | Kriege et al. | |
| 2005/0034301 A1 | 2/2005 | Wang | |
| 2005/0115840 A1 | 6/2005 | Dolan | |
| 2005/0127123 A1 | 6/2005 | Smithers | |
| 2005/0135724 A1 * | 6/2005 | Helvajian et al. | 385/14 |
| 2005/0158576 A1 | 7/2005 | Groll | |
| 2005/0263418 A1 | 12/2005 | Bastus Cortes | |
| 2006/0055084 A1 | 3/2006 | Yamaguchi et al. | |
| 2006/0066771 A1 | 3/2006 | Hayano et al. | |
| 2006/0096740 A1 * | 5/2006 | Zheng | 165/104.26 |
| 2006/0105542 A1 | 5/2006 | Yoo | |
| 2006/0250762 A1 * | 11/2006 | Yang et al. | 361/681 |
| 2006/0255450 A1 * | 11/2006 | Pan et al. | 257/712 |
| 2007/0018817 A1 | 1/2007 | Marmaropoulos et al. | |
| 2007/0045893 A1 | 3/2007 | Asthana et al. | |
| 2007/0053504 A1 | 3/2007 | Sato et al. | |
| 2007/0262062 A1 | 11/2007 | Guth | |
| 2007/0275263 A1 * | 11/2007 | Groll | 428/653 |
| 2008/0101026 A1 * | 5/2008 | Ali | 361/708 |
| 2008/0152859 A1 * | 6/2008 | Nagai | 428/76 |
| 2008/0165485 A1 | 7/2008 | Zadesky et al. | |
| 2008/0166007 A1 | 7/2008 | Hankey et al. | |
| 2008/0192435 A1 * | 8/2008 | Yamamiya | 361/703 |
| 2008/0241478 A1 | 10/2008 | Costin et al. | |
| 2008/0298021 A1 * | 12/2008 | Ali et al. | 361/705 |
| 2008/0309842 A1 * | 12/2008 | Kim | 349/58 |
| 2008/0311369 A1 | 12/2008 | Yokoyama et al. | |
| 2008/0311370 A1 | 12/2008 | Tatarka | |
| 2009/0017242 A1 * | 1/2009 | Weber et al. | 428/35.7 |
| 2009/0019737 A1 | 1/2009 | Moreno | |
| 2009/0049773 A1 * | 2/2009 | Zadesky et al. | 52/204.62 |
| 2009/0091879 A1 | 4/2009 | Lim | |
| 2009/0104949 A1 | 4/2009 | Sato et al. | |
| 2009/0164035 A1 * | 6/2009 | Zadesky et al. | 700/94 |
| 2009/0185344 A1 * | 7/2009 | Zadesky et al. | 361/679.56 |
| 2009/0190290 A1 * | 7/2009 | Lynch et al. | 361/679.01 |
| 2009/0194444 A1 | 8/2009 | Jones | |
| 2009/0197116 A1 | 8/2009 | Cheng et al. | |
| 2009/0236143 A1 * | 9/2009 | Nakamura | 174/520 |
| 2009/0247244 A1 * | 10/2009 | Mittleman et al. | 455/575.1 |
| 2009/0260871 A1 | 10/2009 | Weber | |
| 2009/0279259 A1 * | 11/2009 | Cripe et al. | 361/699 |
| 2009/0305168 A1 | 12/2009 | Heley et al. | |
| 2009/0321909 A1 * | 12/2009 | Gu et al. | 257/686 |
| 2010/0015578 A1 | 1/2010 | Falsafi et al. | |
| 2010/0053885 A1 * | 3/2010 | Ali | 361/679.54 |
| 2010/0061039 A1 * | 3/2010 | Sanford et al. | 361/679.01 |
| 2010/0061055 A1 * | 3/2010 | Dabov et al. | 361/679.56 |
| 2010/0065313 A1 * | 3/2010 | Takeuchi et al. | 174/258 |
| 2010/0072952 A1 * | 3/2010 | Nakajima | 320/150 |
| 2010/0073864 A1 * | 3/2010 | Hwang et al. | 361/679.47 |
| 2010/0114346 A1 * | 5/2010 | Zadesky et al. | 700/94 |
| 2010/0142154 A1 * | 6/2010 | Collet et al. | 361/714 |
| 2010/0159273 A1 | 6/2010 | Filson et al. | |
| 2010/0159274 A1 | 6/2010 | Kleber | |
| 2010/0209721 A1 | 8/2010 | Irikura et al. | |
| 2010/0209722 A1 | 8/2010 | Yoshida | |
| 2010/0214744 A1 * | 8/2010 | Liang | 361/714 |
| 2010/0254092 A1 * | 10/2010 | Dong et al. | 361/705 |
| 2010/0265662 A1 * | 10/2010 | Tracy et al. | 361/714 |
| 2010/0273530 A1 * | 10/2010 | Jarvis et al. | 455/566 |
| 2010/0284158 A1 * | 11/2010 | Sutardja | 361/749 |
| 2010/0294426 A1 | 11/2010 | Nashner | |
| 2010/0300909 A1 | 12/2010 | Hung | |
| 2010/0309369 A1 * | 12/2010 | Jarvis et al. | 348/371 |
| 2010/0309631 A1 * | 12/2010 | Hill et al. | 361/705 |
| 2011/0008618 A1 | 1/2011 | Weedlun | |
| 2011/0012842 A1 * | 1/2011 | Lee et al. | 345/173 |
| 2011/0038123 A1 * | 2/2011 | Janik et al. | 361/717 |
| 2011/0048755 A1 | 3/2011 | Su et al. | |
| 2011/0051337 A1 | 3/2011 | Weber et al. | |
| 2011/0089039 A1 * | 4/2011 | Nashner | 205/50 |
| 2011/0089067 A1 | 4/2011 | Scott et al. | |
| 2011/0114840 A1 * | 5/2011 | Yamazaki et al. | 250/338.1 |
| 2011/0116246 A1 * | 5/2011 | Lee et al. | 361/761 |
| 2011/0123737 A1 | 5/2011 | Nashner | 428/34.1 |
| 2011/0155901 A1 | 6/2011 | Vestal | |
| 2011/0164365 A1 * | 7/2011 | Mcclure et al. | 361/679.3 |
| 2011/0164372 A1 * | 7/2011 | Mcclure et al. | 361/679.26 |
| 2011/0186455 A1 | 8/2011 | Du et al. | |
| 2011/0188179 A1 * | 8/2011 | Myers et al. | 361/679.01 |
| 2011/0193928 A1 | 8/2011 | Zhang | |
| 2011/0193929 A1 | 8/2011 | Zhang et al. | |
| 2011/0194574 A1 | 8/2011 | Zhang et al. | |

(56) References Cited

U.S. PATENT DOCUMENTS

| | | | |
|---|---|---|---|
| 2011/0242764 A1* | 10/2011 | Hill et al. | 361/705 |
| 2011/0253411 A1 | 10/2011 | Hum et al. | |
| 2011/0255218 A1* | 10/2011 | Pakula et al. | 361/679.01 |
| 2011/0305875 A1* | 12/2011 | Sanford et al. | 428/174 |
| 2011/0315667 A1 | 12/2011 | Reichenbach et al. | |
| 2012/0043306 A1 | 2/2012 | Howerton et al. | |
| 2012/0044635 A1* | 2/2012 | Rothkopf et al. | 361/679.54 |
| 2012/0081830 A1 | 4/2012 | Yeates et al. | |
| 2012/0100348 A1 | 4/2012 | Brookhyser et al. | |
| 2012/0140419 A1* | 6/2012 | Ribas et al. | 361/714 |
| 2012/0176277 A1* | 7/2012 | Malek et al. | 343/702 |
| 2012/0212904 A1* | 8/2012 | Fleming et al. | 361/679.56 |
| 2012/0248001 A1 | 10/2012 | Nashner | |
| 2012/0275130 A1 | 11/2012 | Hsu et al. | |
| 2012/0275131 A1 | 11/2012 | Huang et al. | |
| 2013/0058039 A1* | 3/2013 | Lee | 361/690 |
| 2013/0075126 A1* | 3/2013 | Nashner et al. | 174/50 |
| 2013/0083500 A1* | 4/2013 | Prest et al. | 361/757 |
| 2013/0129986 A1 | 5/2013 | Heley et al. | |
| 2014/0009873 A1 | 1/2014 | Nashner et al. | |
| 2014/0134429 A1* | 5/2014 | Weber et al. | 428/336 |

FOREIGN PATENT DOCUMENTS

| | | |
|---|---|---|
| CN | 101204866 | 6/2008 |
| DE | 195 23 112 | 6/1996 |
| DE | 102005048870 A1 | 4/2007 |
| EP | 0 114 565 A1 | 8/1984 |
| EP | 0 633 585 A | 1/1995 |
| EP | 0 997 958 A1 | 5/2000 |
| EP | 2 399 740 A1 | 12/2011 |
| EP | 2488369 B1 | 3/2014 |
| GB | 788 329 A | 12/1957 |
| JP | 57-149491 A | 9/1982 |
| JP | 03 013331 A | 1/1991 |
| JP | 03 138131 A | 6/1991 |
| JP | 3-203694 A | 9/1991 |
| JP | 06-126192 | 5/1994 |
| JP | 7-204871 A | 8/1995 |
| JP | 2000-000167 | 1/2000 |
| JP | 2003055794 | 2/2003 |
| JP | 2008 087409 A | 4/2008 |
| WO | WO 98/53451 | 11/1998 |
| WO | WO 0077883 | 12/2000 |
| WO | WO 01/15916 A1 | 3/2001 |
| WO | WO 01/34408 | 5/2001 |
| WO | WO 2006/124279 A2 | 11/2006 |
| WO | WO 2007/088233 A1 | 8/2007 |
| WO | WO 2008/092949 A1 | 8/2008 |
| WO | WO 2009/051218 A1 | 4/2009 |
| WO | WO 2010/095747 A1 | 8/2010 |
| WO | WO 2010/135415 A2 | 11/2010 |
| WO | WO 2011/047325 A1 | 4/2011 |

OTHER PUBLICATIONS

"Thermal Shock Resistant Conformal Coating", Product Data Sheet, Dymax Corporation, Jul. 9, 2007, pp. 1-2.

"Marking Lasers: Marking without Limitations", Trumpf Inc., Sep. 10, 2007, pp. 1-36.

"UV-Curing Sheet Adhesives", ThreeBond Technical News, Issued Jul. 1, 2009, 8 pages.

Chang, "Lasers Make Other Metals Look Like Gold", New York Times, nytimes.com, 2 pgs., Jan. 31, 2008.

"Database EPI" Week 201107 Thomas Scientific, London, GB; AN 2010-Q46184, Nov. 17, 2010, 1 pg.

* cited by examiner

THIN MULTI-LAYERED STRUCTURES PROVIDING RIGIDITY AND CONDUCTIVITY

BACKGROUND OF THE INVENTION

Electronic devices, such as computers, televisions, media players, etc., all include electronic components that generate heat. The heat can be dissipated by heat sinks, fans, etc. In the case of compact portable electronic devices, the limited area and density of electronic components can made heat dissipation more difficult. Since some electronic components produce more heat than others, there is a need to distribute heat in the compact portable electronic device. Also, there can also be a need for improved electrical connection with a ground plane internal to the compact portable electronic device. Hence, there are continuing needs to provide improved ways to dissipate and distribute heat and/or enhance electrical connection in an electronic device, particularly a compact portable electronic device.

SUMMARY

Embodiments of the invention pertain to electronic devices having a multi-layer structure that provides enhanced conductivity, namely, for improved thermal and/or electrical conductivity. The multi-layer structure can have a plurality of adjacent layers. At least one layer can primarily provide structural rigidity, and at least another layer can primarily provide enhanced conductivity (thermal and/or electrical). The layer of high conductivity can serve to provide the electronic device with greater ability to disperse generated heat and/or to provide an accessible voltage potential (e.g., ground plane). The adjacent layers can be compressed together in a cladding process to yield an integral metal structure. Alternatively, the adjacent layers can be secured together by other means, such as bonding.

Given that multi-layer structure has a plurality of adjacent layers for thermal and/or electrical conductivity, electronic components that are generating heat or requiring electrical grounding need access to the layer with high conductivity. Depending on the orientation and/or configuration of the multi-layer structure, one or more openings can be provided in the layer providing structural rigidity so that access to the layer providing the high conductivity can be had via the one or more openings in the layer providing structural rigidity.

Advantageously, the multi-layer structure can provide enhanced conductivity using an otherwise required structural component and without necessitating an increase in thickness. Consequently, the enhanced conductivity can be provided without significantly sacrificing structural support. Hence, the multi-layer structure is well suited for compact portable electronic devices where thin and compact components are a necessity.

The invention can be implemented in numerous ways, including as a method, system, device, or apparatus. Several embodiments of the invention are discussed below.

As a portable electronic device, one embodiment can, for example, include at least an outer housing, an internal support structure provided within the outer housing, and at least one electrical component provided within the outer housing. The internal support structure is a multi-layered structure having at least (i) a first layer form of a first material that primarily provides rigidity to the multi-layered structure, and (ii) a second layer formed of a second material that provides for enhanced conductivity as compared to conductivity of the first material. The second material is different than the first material. The at least one electrical component being thermally and/or electrically coupled to the second layer of the internal support structure.

As a method for assembly of a portable electronic device, one embodiment can, for example, include at least: providing a multi-layer metal structure to provide support for internal components of the portable electronic device, the multi-layer metal structure including at least one structural layer and at least one highly conductive layer; providing heat-generating electrical components of the portable electronic device that cooperate to support functions of the portable electronic device; and coupling at least one of the heat generating electrical components to the at least one highly conductive layer of the multi-layered structure.

As a method for assembly of a portable electronic device, one embodiment can, for example, include at least: providing a multi-layered metal structure to provide support for internal components of the portable electronic device, the multi-layer metal structure including at least a first metal layer and at least a second metal layer, the first metal layer having at least one opening that exposes the second metal layer; providing heat-generating electrical components that cooperate to support functions of the portable electronic device; securing at least one of the heat-generating electrical components internal to the portable electronic device and adjacent the at least one opening in the first metal layer of the multi-layer metal structure; and thermally and/or electrically coupling the at least one of the secured heat generating electrical components to the second metal layer of the multi-layered structure via the at least one opening in the first metal layer.

Other aspects and advantages of embodiments of the invention will become apparent from the following detailed description taken in conjunction with the accompanying drawings which illustrate, by way of example, the principles of the invention.

BRIEF DESCRIPTION OF THE DRAWINGS

The invention will be readily understood by the following detailed description in conjunction with the accompanying drawings, wherein like reference numerals designate like structural elements, and in which.

DETAILED DESCRIPTION OF EMBODIMENTS OF THE INVENTION

Embodiments of the invention pertain to electronic devices having a multi-layer structure that provides enhanced conductivity, namely, for improved thermal and/or electrical conductivity. The multi-layer structure can have a plurality of adjacent layers. At least one layer can primarily provide structural rigidity, and at least another layer can primarily provide enhanced conductivity (thermal and/or electrical). The layer of high conductivity can serve to provide the electronic device with greater ability to disperse generated heat and/or to provide an accessible voltage potential (e.g., ground plane). The adjacent layers can be compressed together in a cladding process to yield an integral metal structure. Alternatively, the adjacent layers can be secured together by other means, such as bonding.

Given that multi-layer structure has a plurality of adjacent layers for thermal and/or electrical conductivity, electronic components that are generating heat or requiring electrical grounding need access to the layer with high conductivity. Depending on the orientation and/or configuration of the multi-layer structure, one or more openings can be provided in the layer providing structural rigidity so that access to the layer providing the high conductivity can be had via the one or more openings in the layer providing structural rigidity.

Advantageously, the multi-layer structure can provide enhanced conductivity using an otherwise required structural component and without necessitating an increase in thickness. Consequently, the enhanced conductivity can be provided without significantly sacrificing structural support. Hence, the multi-layer structure is well suited for compact portable electronic devices where thin and compact components are a necessity.

Embodiments of the invention are discussed below with reference to FIGS. 1-9. However, those skilled in the art will readily appreciate that the detailed description given herein with respect to these figures is for explanatory purposes as the invention extends beyond these limited embodiments. The illustrations provided in these figures are not necessarily drawn to scale; instead, the illustrations are presented in a manner to facilitate presentation.

Figure 1:
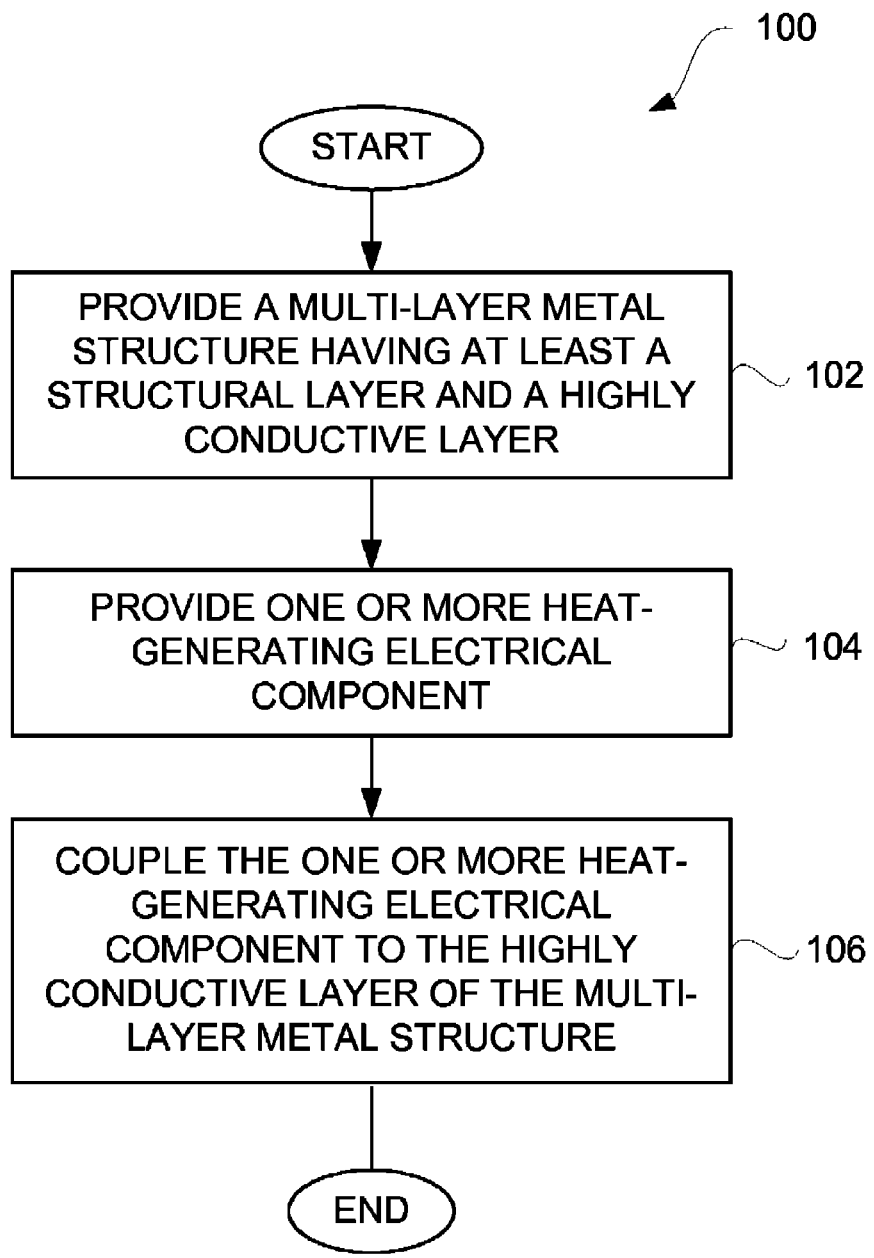
FIG. 1 is a flow diagram of a conductivity coupling process according to one embodiment.

FIG. 1 is a flow diagram of a conductivity coupling process 100 according to one embodiment. The conductivity coupling process 100 can operate to provide enhanced thermal and/or electrical coupling for electrical components utilized within a housing of an electronic device. The conductivity coupling provided allows for thermal and/or electrical coupling with efficient use of space, thus making it well suited for use within portable electronic devices.

The conductivity coupling process 100 can initially provide 102 a multi-layer metal structure having at least a structural layer and a highly conductive layer. The multi-layer metal structure can be associated with a support structure of an electronic device, such as a portable electronic device. The support structure can be internal to a housing of the electronic device, or can be part of the housing of the electronic device. In addition, one or more heat-generating electrical components can be provided 104. The one or more heat-generating electrical components can, for example, be electronic devices, such as packaged integrated circuits. The one or more heat-generating electrical components can then be coupled 106 to the highly conductive layer of the multi-layer metal structure. As a result, even though the multi-layer metal structure has a plurality of different layers, with some layers offering more structural support and other layers offering greater conductivity, a heat generating electrical component can be coupled to a highly conductive layer so as to facilitate thermal and/or electrical conductivity.

The multi-layer metal structure includes two or more layers. Typically, the two or more layers are metal layers. In one embodiment, at least one of the layers of the multi-layer metal structure is a layer that offers high conductivity. Typically, the conductivity for this metal layer would be high or enhanced for one or both of thermal and electrical conductivity. As an example, the layer that offers high conductivity can be formed from one or more of copper, aluminum, silver or gold. The other of the layers of the multi-layer metal structure typically primarily provide structural support. As an example, the other of all the layers that primarily provide structural support can be formed from steel, such as stainless steel.

Figure 2A:
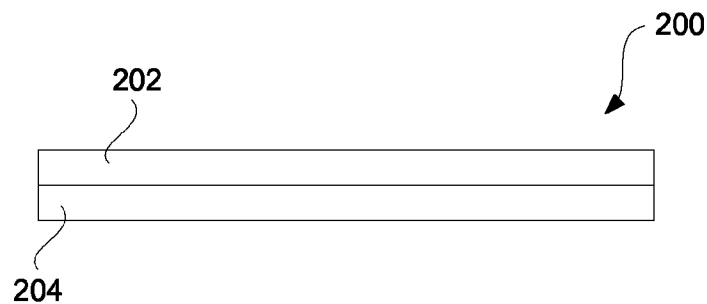
FIG. 2A illustrates a cross-sectional view of a multi-layer metal structure according to one embodiment.

The multi-layer metal structure can also be formed such that the individual layers are essentially integral with one another or otherwise, bonded together. As an example, the multi-layer metal structure can be a clad metal structure in which cladding is used to bind the multiple layers together. In one embodiment, the multi-layer metal structure is a thin multi-layered structure, which can have a thickness that is less than about 1 mm. In another embodiment, the multi-layer metal structure is a thin multi-layered structure, which can have a thickness that is less than about 0.5 mm. In still another embodiment, the multi-layer metal structure is a thin multi-layered structure, which can have a thickness that is about 0.3 mm. Although the multi-layer structure is generally thin, the thickness is dependent upon the number of layers utilized and the thickness of the individual layers. For example, with a thin multi-layered structure, the thickness of a given layer can be on the order of 0.05 mm to 0.5 mm FIG. 2A illustrates a cross-sectional view of a multi-layer metal structure 200 according to one embodiment. The multiple-layer metal structure 200 is a multi-layer structure formed from a first layer 202 and a second layer 204. In this embodiment, the first layer 202 can primarily provide structural support, while the second layer 204 can primarily provide enhanced conductivity.

Figure 2B:
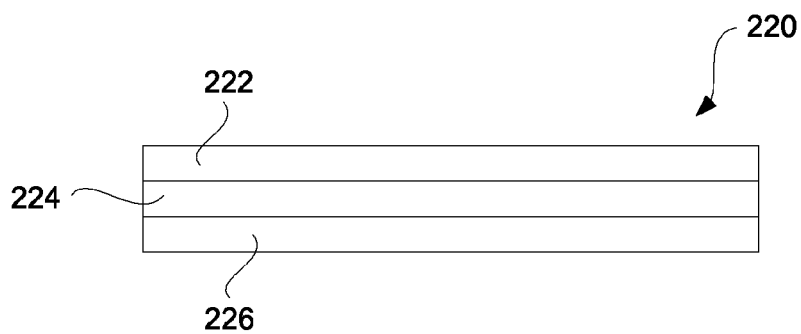
FIG. 2B illustrates a cross-sectional view of a multi-layer metal structure according to another embodiment.

FIG. 2B illustrates a cross-sectional view of a multi-layer metal structure 220 according to another embodiment. The multiple-layer metal structure 220 is a multi-layer structure formed from a first layer 222, a second layer 224, and a third layer 226. In this embodiment, the first layer 222 and the third layer 226 can primarily provide structural support, while the second layer 224 can primarily provide enhanced conductivity. For example, in thin applications, the thickness of each of the layers 222, 224 and 226 can be about 0.1 mm to 0.3 mm; hence, the overall thickness of the multiple-layer metal structure 220 can be on the order of about 0.3 mm to 0.9 mm. While the overall thickness of the multiple-layer metal structure 220 remains thin, the use of the second layer 224 (which is distinct from the first layer 222 and the third layer 226) operates to provide a high conductivity internal layer that is sandwiched by other layers that provide structural rigidity to the multi-layer metal structure 220. The overall strength of the multi-layer metal structure 220 can be rendered similar to that offered by a uniform single layer metal structure of the structural rigidity material which has the same thickness.

Figure 2C:
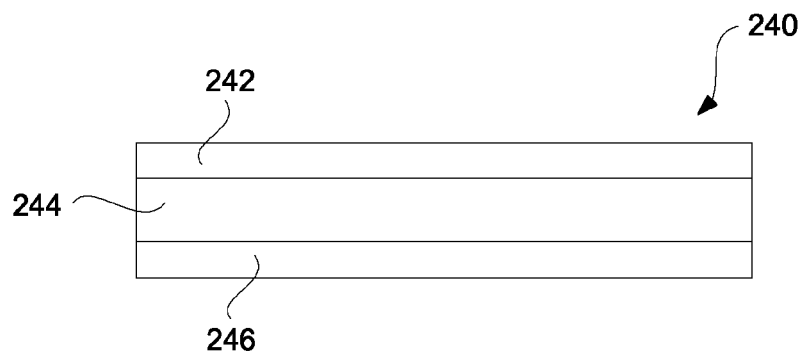
FIG. 2C illustrates a cross-sectional view of a multi-layer metal structure according to another embodiment.

FIG. 2C illustrates a cross-sectional view of a multi-layer metal structure 240 according to another embodiment. The multiple-layer metal structure 240 is a multi-layer structure formed from a first layer 242, a second layer 244, and a third layer 246. In this embodiment, the first layer 242 and the third layer 246 can primarily provide structural support, while the second layer 244 can primarily provide enhanced conductivity. In general, the multiple-layer metal structure 240 illustrated in FIG. 2C is generally similar to the multiple-layer metal structure 220 illustrated in FIG. 2B. The difference, however, is that the second layer 244 in FIG. 2C has a greater thickness than the second layer 224 illustrated in FIG. 2B. The greater the thickness of the second layer 244, the greater the thermal mass available to absorb heat. Hence, the multi-layer metal structure 240 illustrated in FIG. 2C can offer greater thermal conductivity and heat absorption than does the multi-layer metal structure 220. Hence, if the primarily conductive layer of a multi-layer metal structure is to be utilized for thermal conductivity, the thickness, and thus the mass (or volume), of the primarily conductive layer can be configured as appropriate for the desired application.

Figure 3A:
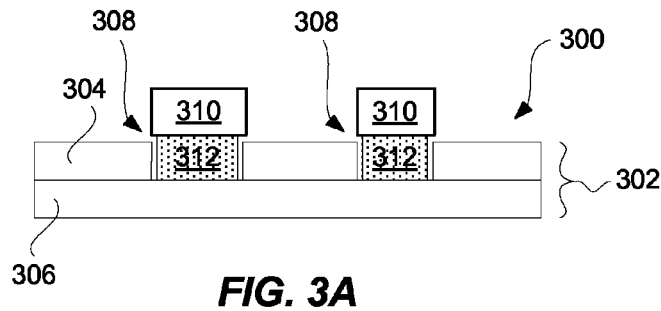
FIG. 3A illustrates a cross-sectional view of a conductivity assembly according to one embodiment.

FIG. 3A illustrates a cross-sectional view of a conductivity assembly 300 according to one embodiment. The conductivity assembly 300 includes a multi-layer metal structure 302. The multi-layer metal structure 302 includes a support layer 304 and a conductivity layer 306. The support layer 304 primarily provides structural rigidity to the multi-layer metal structure 302, and the conductivity layer 306 provides high conductivity (e.g., thermal and/or electrical) to the multi-layer metal structure 302. The conductivity assembly 300 also includes one or more heat-generating electrical components 310. In the event that the heat-generating electrical components 310 are placed adjacent the support layer 304 of the multi-layer metal structure 302, one or more openings 308 can be provided through the support layer 304. As a result, the one or more heat-generating electrical components 310 can gain access to the conductivity layer 306 via the one or more openings 308. In one implementation, as illustrated in FIG. 3A, the one or more heat-generating electrical components 310 can be placed over a corresponding one or more of the openings 308. In addition, a compliant conductive material 310 can be placed in the one or more openings 308 between the one or more heat-generating electrical components 310 and the conductivity layer 306 so as to provide conductive coupling therebetween. As a result, the one or more heat-generating electrical components 310 can be coupled to the conductivity layer 306. Typically, in such an embodiment, the conductivity layer 306 is provided for thermal conductivity and thus the compliant conductive material 312 can facilitate thermal coupling between the heat-generating electrical component 310 and the conductivity layer 306. The compliant conductive material 310 can vary depending upon implementation, but could include silicone with conductive elements (e.g., graphite), thermally conductive adhesive, silver paste, etc.

Figure 3B:
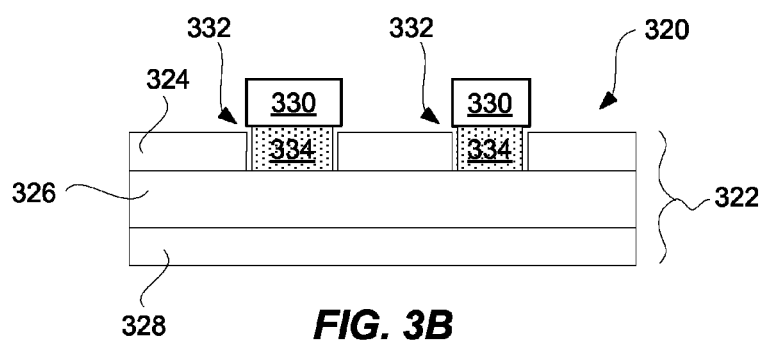
FIG. 3B illustrates a cross-sectional view of a conductivity assembly according to another embodiment.

FIG. 3B illustrates a cross-sectional view of a conductivity assembly 320 according to another embodiment. The conductivity assembly 320 is generally similar to the conductivity assembly 300 illustrated in FIG. 3A. However, the primary distinction between the two embodiments is that the conductivity assembly 320 utilizes a multi-layer metal structure 322 that consist of three layers, whereas the conductivity assembly 300 illustrated in FIG. 3A utilizes a multi-layer metal structure 302 that consist of two layers.

The conductivity assembly 320 includes a multi-layer metal structure 322. The multi-layer metal structure 322 includes a support layer 324, a conductivity layer 326 and another support layer 328. The support layers 324 and 328 primarily provides structural rigidity to the multi-layer metal structure 322, and the conductivity layer 326 provides high conductivity (e.g., thermal and/or electrical) to the multi-layer metal structure 322. The conductivity layer 326 is provided in between the first support layer 324 and the second support layer 328. In other words, the conductivity layer 326 is sandwiched in between the first support layer 324 and the second support layer 328. The multi-layer structure 322 can have the different layers integrally formed, such as through cladding.

The conductivity assembly 320 also includes one or more heat-generating electrical components 330. In the event that the heat-generating electrical components 330 are placed adjacent the support layer 324 of the multi-layer metal structure 322, one or more openings 332 can be provided through the support layer 324. As a result, the one or more heat-generating electrical components 330 can gain access to the conductivity layer 326 via the one or more openings 332. In one implementation, as illustrated in FIG. 3B, the one or more heat-generating electrical components 330 can be placed over a corresponding one or more of the openings 332. In addition, a compliant conductive material 334 can be placed in the one or more openings 332 between the one or more heat-generating electrical components 330 and the conductivity layer 326 so as to provide conductive coupling therebetween. As a result, the one or more heat-generating electrical components 330 can be coupled to the conductivity layer 326. Typically, in such an embodiment, the conductivity layer 326 is provided for thermal conductivity and thus the compliant conductive material 334 can facilitate thermal coupling between the heat-generating electrical component 330 and the conductivity layer 326. The compliant conductive material 334 can vary depending upon implementation, but could include silicone with conductive elements (e.g., graphite), thermally conductive adhesive, silver paste, etc.

Figure 3C:
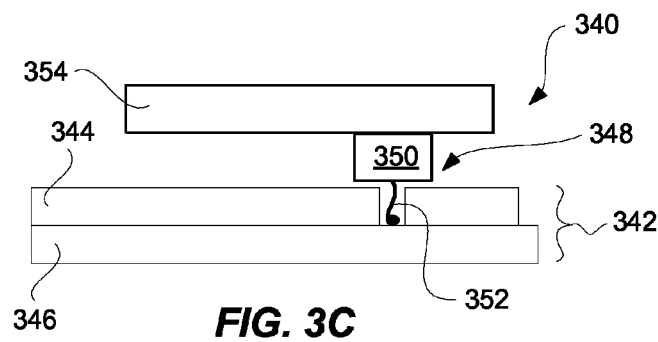
FIG. 3C illustrates a cross-sectional view of a conductivity assembly according to another embodiment.

FIG. 3C illustrates a cross-sectional view of a conductivity assembly 340 according to another embodiment. The conductivity assembly 340 includes a multi-layer metal structure 342. The multi-layer metal structure 342 includes a support layer 344 and a conductivity layer 346. The support layer 344 primarily provides structural rigidity to the multi-layer metal structure 342, and the conductivity layer 346 provides high conductivity to the multi-layer metal structure 342. The support layer 344 can have at least one opening 348 to provide access to the conductivity layer 346 through the support layer 344. The conductivity assembly 340 can also include at least one electronic component 350, which is often a heat-generating electrical component. As an example, the electronic component 350 can pertain to an electronic circuit, such as an integrated circuit device (typically provided in an integrated circuit package). The electronic component 350 is able to be electrically connected to the conductivity layer 346 with a conductor 352. The conductor 352 can, for example, be implemented by a wire. In other words, through the opening 348 in the support layer 344, the conductor 352 is able to be electrically connected between the electronic component 350 and the conductivity layer 346. As a result, the conductor 352 can serve to electrically couple the electronic component 352 to the conductivity layer 346. In one implementation, the conductivity layer 346 can provide a ground plane (or other voltage potential) for use by an electronic apparatus that includes the conductivity assembly 340. Advantageously, for electrical coupling, the conductivity layer 346 offers low surface (or contact) resistance. Typically, the electronic component 350, as well as the conductivity assembly 340, would be provided internal to a housing for an electronic apparatus (e.g., portable electronic device). Additionally, within the housing for the electronic apparatus, an electronic substrate 354 can be provided. For example, the electronic substrate 354 can pertain to a printed circuit board or a flexible circuit board. The electronic component 350 can be mounted on and secured to the electronic substrate 354. Hence, in this embodiment, the conductivity layer 346 is electrically coupled to the electronic component 350 by the conductor 352.

Figure 3D:
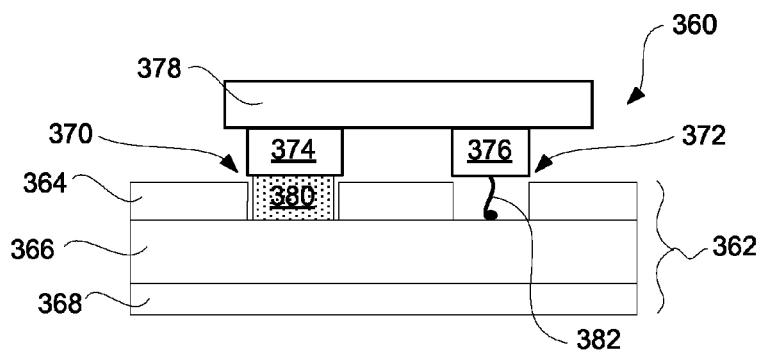
FIG. 3D illustrates a cross-sectional view of a conductivity assembly according to another embodiment.

FIG. 3D illustrates a cross-sectional view of a conductivity assembly 360 according to another embodiment. The conductivity assembly 360 includes a multi-layer metal structure 362. The multi-layer metal structure 362 includes a first support layer 364, a conductivity layer 366 and a second support layer 368. The conductivity layer 366 is provided in between the first support layer 364 and the second support layer 368. In other, the conductivity layer 366 is sandwiched in between the first support layer 364 and the second support layer 368. The multi-layer structure 362 can have the different layers integrally formed, such as through cladding.

To gain access to the conductivity layer 366, a first opening 370 and a second opening 372 can be provided in the first support layer 364. The first opening 370 is configured to facilitate thermal coupling with a heat-generating electrical component 374. For example, the electrical component 374 can be provided over the opening 370 and adjacent to the support layer 364. A compliant conductive material 380 can be deposited in the opening 370 and between the heat-generating electrical component 374 and the conductivity layer 366. In addition, an electrical component 376 can be provided over the opening 372 and adjacent to the support layer 364. The second opening 372 is configured to facilitate electrical coupling with an electronic device 376. A conductive member 382 can be placed in the opening 374 to electrically connect the electronic device 376 to the conductivity layer 366. Additionally, within the housing for the electronic apparatus, an electronic substrate 378 can be provided. For example, the electronic substrate 378 can pertain to a printed circuit board or a flexible circuit board. The heat-generating electrical component 374 and the electronic component 376 can both be mounted on and secured to the electronic substrate 378. Hence, in this embodiment, the conductivity layer 366 is thermally coupled to the heat-generating electrical component 374 and also electrically coupled to the electronic component 376.

In this embodiment, the conductivity layer 366 is thermally coupled to the heat-generating electrical component 374 and is electrically coupled to the electronic component 376. Hence, in this embodiment, the conductivity layer 366 serves to provide both thermal and electrical conductivity. For example, the thermal conductivity can provide heat dispersion and/or removal as well as electrical coupling (such as for grounding or other voltage potential).

Figure 4:
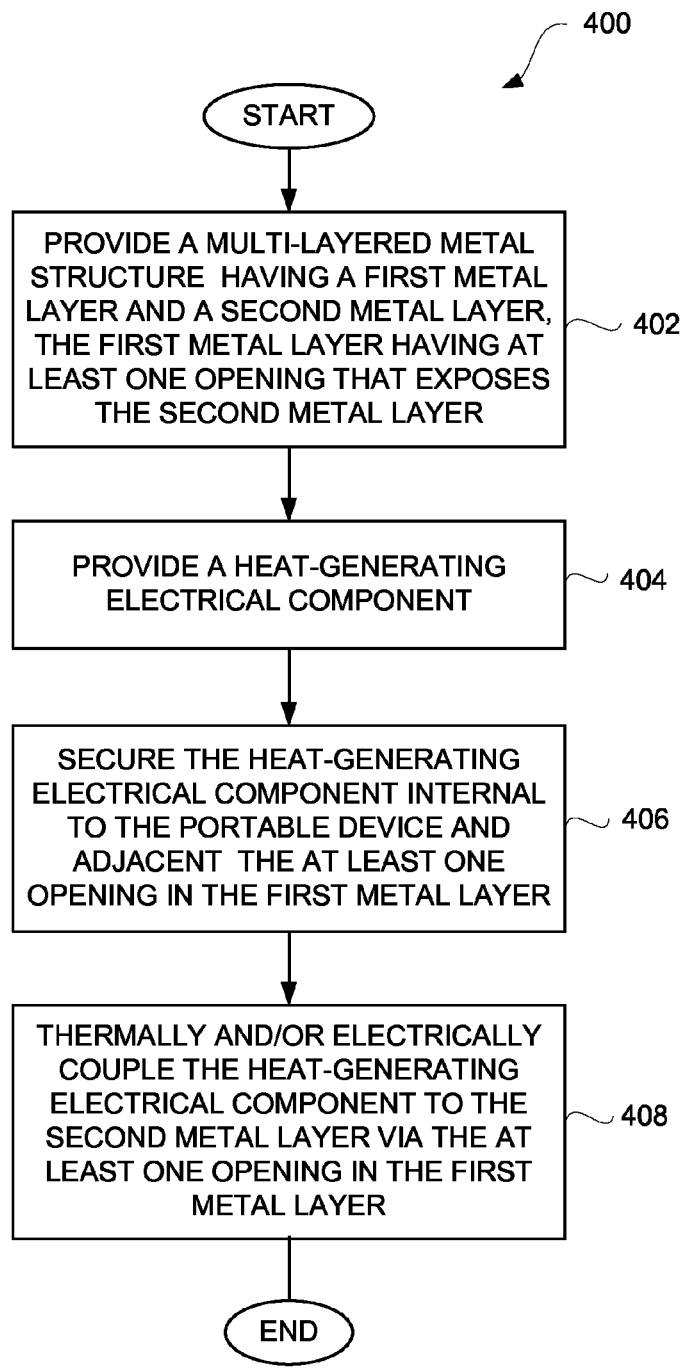
FIG. 4 is a flow diagram of a conductivity coupling process according to one embodiment.

FIG. 4 is a flow diagram of a conductivity coupling process 400 according to one embodiment. The conductivity coupling process 400 can operate to provide enhanced thermal and/or electrical coupling for electrical components utilized within a housing of an electronic device. The conductivity coupling provided allows for thermal and/or electrical coupling with efficient use of space, thus making it well suited for use within portable electronic devices.

The conductivity coupling process 40 can provide 402 a multi-layered metal structure having a first metal layer and a second metal layer. The first metal layer can have at least one opening that exposes a second metal layer. A heat-generating electrical component can also be provided 404. Thereafter, the heat-generating electrical component can be secured 406 internal to the portable electronic device and adjacent at least one opening in the first metal layer. Also, the heat-generating electrical components can be thermally and/or electrically coupled 408 to the second metal layer via the at least one opening in the first metal layer. In this regard, by coupling 408 the heat-generating electrical component to the second metal layer, the second metal layer, which offers enhanced conductivity (as compared to the first metal layer), provides enhanced thermal and/or electrical coupling with the second metal layer having the enhanced conductivity. Following the coupling 408, the conductivity coupling process 400 can end.

Figure 5:
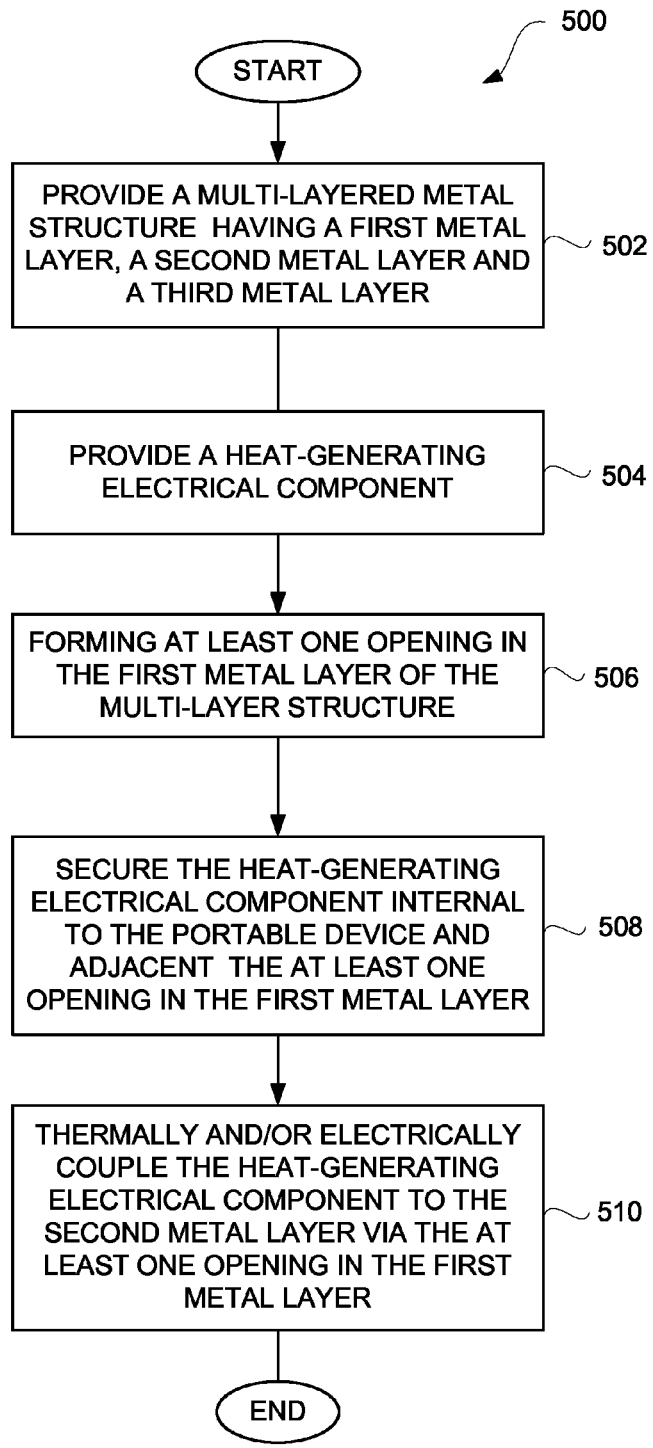
FIG. 5 illustrates a flow diagram of a conductivity coupling process according to another embodiment.

FIG. 5 illustrates a flow diagram of a conductivity coupling process 500 according to another embodiment. The conductivity coupling process 500 operates to provide enhanced thermal and/or electrical coupling for one or more electrical components utilized within a housing of an electronic device. The conductivity coupling provided allows for thermal and/or electrical coupling with efficient use of space, thus making it well suited for use within portable electronic devices.

The conductivity coupling process 500 can provide 502 a multi-layered metal structure having a first metal layer, a second metal layer, and a third metal layer. In one implementation, the first and third metal layers are primarily provided for structural support, such as rigidity for the multi-layered metal structure, and the second metal layer is primarily provided for enhanced conductivity. In addition, a heat-generating electrical component can be provided 504. Further, at least one opening in the first metal layer of the multi-layer structure can be formed 506. Thereafter, the heat-generating electrical component can be secured 508 internal to the electronic device and adjacent the at least one opening in the first metal layer. Next, the heat-generating electrical component can be thermally and/or electrically coupled 510 to the second metal layer via at least one opening in the first metal layer. Following the coupling 510, the conductivity coupling process 500 can end.

Figure 6:
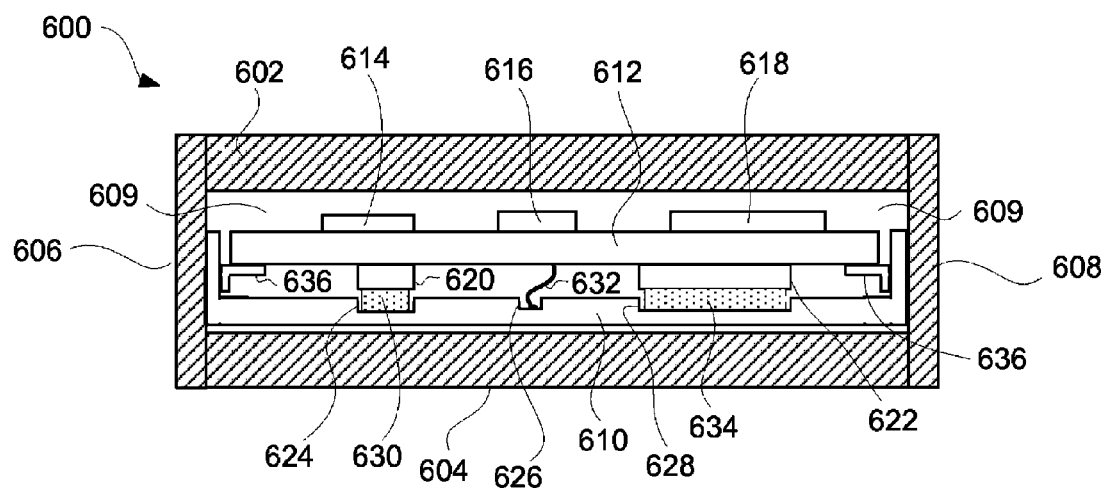
FIG. 6 is a cross-sectional view of a portable electronic device according to one embodiment.

FIG. 6 is a cross-sectional view of a portable electronic device 600 according to one embodiment. The portable electronic device 600 includes an outer housing that has a front housing portion 602, a back housing portion 604, a side housing portion 606 and a side housing portion 608. Internal to the outer housing for the portable electronic device 600 is an interior area 609.

Various structures and electrical components can be provided within the interior area 609 to facilitate operation of the portable electronic device 600. In this embodiment, included within the internal area 609 is a multi-layer support structure 610. The multi-layer support structure 610 can, for example, pertain to a frame, tray or internal chassis. The multi-layer support structure 610 can be formed from two or more layers that are integrally bonded together as discussed above. Of the two or more layers, at least one is primarily a support layer and at least one is primarily a conductivity layer. Also included within the internal area 609 is a substrate 612. The substrate 612 supports electrical interconnections with a plurality of electrical components, including electrical components 614, 616, 618, 620 and 622. As illustrated in FIG. 6, the electrical components 614, 616 and 618 are provided on a top side of the substrate 612, while the electrical components 620 and 622 are provided on a bottom side of the substrate 612.

As arranged within the internal area 609, the substrate 612 is placed over or adjacent the multi-layer support structure 610. Additionally, to facilitate conductivity between certain electrical components mounted on the substrate 612, the multi-layer support structure 610 can include openings 624, 626 and 628 that effectively expose the bottom or internal layer (e.g., conductivity layer) which offers enhanced conductivity as compared to the top layer (e.g., support layer). As illustrated in FIG. 6, the placement of the openings 624, 626 and 628 can correspond to and be positioned adjacent the electrical components mounted on the bottom side of the substrate 612.

In particular, the electrical component 620 can be provided adjacent the opening 624. Additionally, a compliant material 630, which is also conductive, can be placed between the electrical component 620 and the opening 624. Hence, the arrangement of the electrical component 620 and the opening 624 (as well as the placement of the compliant material 630) establishes a high conductivity path from the electrical component 620 and the bottom or internal layer (e.g., conductivity layer) of the multi-layer support structure 610. A conductor 632, such as a wire) can be coupled between the substrate 612 (or electrical component(s) thereon) to the bottom or internal layer (e.g., conductivity layer) of the multi-layer support structure 610 so as to provide electrical coupling therebetween. The electrical component 622 can be provided adjacent the opening 628. Additionally, a compliant material 634, which is also conductive, can be placed between the electrical component 622 and the opening 628. Hence, the arrangement of the electrical component 622 and the opening 628 (as well as the placement of the compliant material 634) establishes a high conductivity path from the electrical component 622 to the bottom or internal layer (e.g., conductivity layer) of the multi-layer support structure 610.

Accordingly, in the embodiment illustrated in FIG. 6, the conductor 632 is provided to render an electrical connection between the substrate 612 and the bottom or internal layer of the multi-layer support structure 610, and the opening 624 and 628 (along with the compliant material 630 and 634) are utilized to provide thermal coupling between the electrical components 620 and 622 and the bottom or internal layer of the multi-layer support structure 610 which offers high thermal conductivity. Still further, within the internal area 609, one or more brackets 636 can be provided to secure the substrate 612 relative to the multi-layer support structure 610.

FIGS. 7A-7D illustrate assembly of internal portions of a portable electronic device according to one embodiment.

Figure 7A:
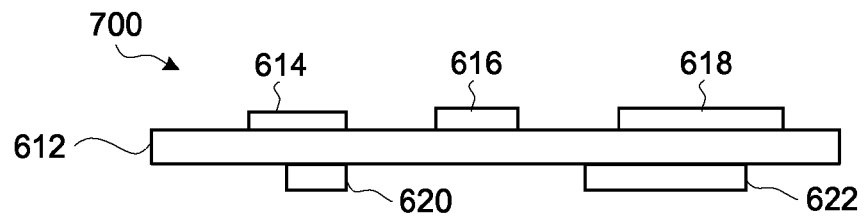
FIGS. 7A-7D illustrates assembly of internal portions of a portable electronic device according to one embodiment.

FIG. 7A illustrates a sub-assembly 700 according to one embodiment. The sub-assembly 700 includes a substrate 612 that includes various electrical components 614-622 mounted thereon. As illustrated in FIG. 7A, the electrical components 614, 616 and 618 are provided on a top side of the substrate 612, while the components 620 and 622 are mounted on the bottom side of the substrate 622. The electrical components 614-622 can refer to integrated circuits or other electronic components (e.g., amplifiers, microprocessor, microcontroller, etc.), which are typically provided as packaged products. The sub-assembly 700 can be referred to as a printed circuit board, a flex circuit and the like having electrical components mounted thereto.

Figure 7B:
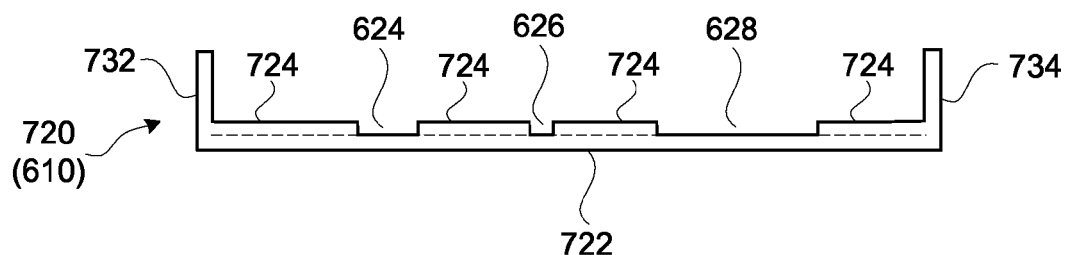

FIG. 7B illustrates a multi-layer support structure 720 according to one embodiment. The multi-layer support structure 720 is one implementation of the multi-layer support structure 610 illustrated in FIG. 6. In this regard, the multi-layer substrate 720 includes a first layer 722 and a second layer 724, but as noted above could include additional layers. The first layer can primarily provide structural rigidity, and the second layer can primarily provide high conductivity. Within the first layer 722, a plurality of openings 624, 626 and 628 are formed to facilitate access to the second layer 724. Namely, at the openings 624, 626 and 628, the corresponding portion of the first layer 722 has been removed. However, the overall percentage of the first layer 722 being removed to support the openings 624, 626 and 628 is relatively small so that the strength, i.e. rigidity, of the first layer 722 is not significantly compromised. The multi-layer substrate 720 can also include first and second side portions 732 and 734, respectively.

The openings 624, 626 and 628 in the first layer 722 can be formed in a variety of ways. In one embodiment, the openings can be selectively formed using a semiconductor chemical etching process. In another embodiment, the openings can be selectively formed using a mechanical machining process. In still another embodiment, the opening can be selectively formed in the first layer 722 on fabrication, such as by punching through the opening in the first layer 722 before bonding it to the second layer 724.

It should be noted that at the openings 624, 626 and 628 the exposed metal associated with the second layer 724 can be susceptible to corrosion. The susceptibility to corrosion is dependent on the particular metal utilized in the second layer 724. For example, if the metal utilize for the second layer 724 is copper, it can corrode fairly rapidly. The conductivity of the second layer degrades when the interfacing surface of the second layer 724 at the openings 624, 626 and 628 has corroded. Hence, an additional coating (not shown) can be provided at least at the opening 624, 626 and 628 to prevent corrosion, namely, by sealing at least the exposed portions of the second layer 724. The coating is typically a relatively conductive material that is substantially less susceptibly to corrosion, such as nickel or gold which are considered anti-corrosive materials.

Figure 7C:
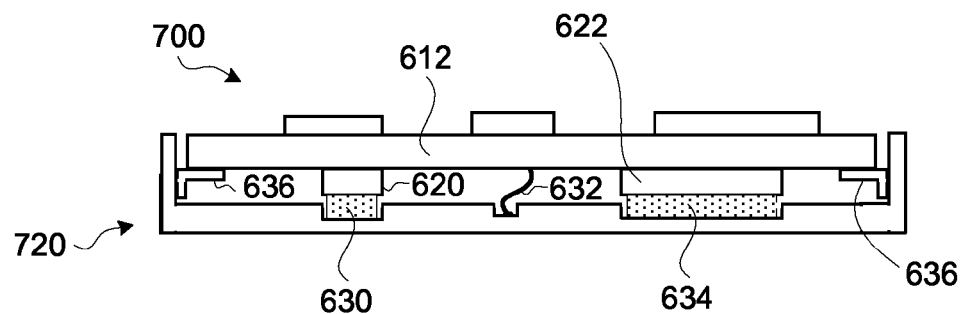

FIG. 7C illustrates a compact assembly 760 according to one embodiment. The compact assembly 760 pertains to an assembly of the substrate 700 shown in FIG. 7A and the multi-layer support structure 720 shown in FIG. 7B. As assembled, the substrate 700 is provided over and adjacent the first layer 722 of the multi-layer support structure 720. Additionally, the electrical component 620 is provided over and adjacent the corresponding opening 624 in the first layer 722 of the multi-layer support structure 720. Similarly, the electrical component 622 is provided over and adjacent the corresponding opening 628 in the first layer 722 of the multi-layer support structure 720. Additionally, the compliant formal material 630 and 634 can be respectively provided in the openings 624 and 628 so as to facilitate conductive coupling. The bracket 636 can be used to secure the substrate 612 relative to the multi-layer support structure 720. The bracket 636 can utilize adhesive, rivets, screws, welds, and the like to couple the substrate 612 to the multi-layer support structure 720.

Figure 7D:
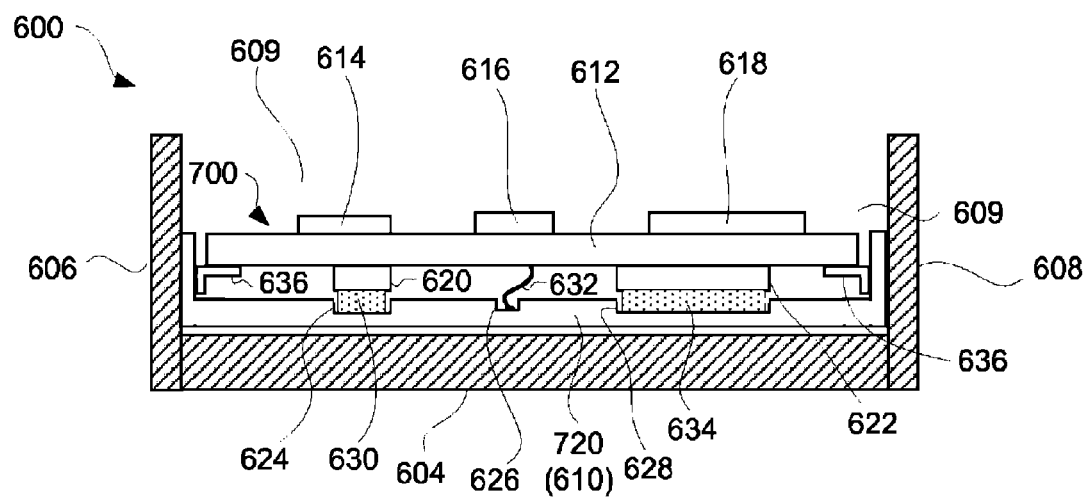

FIG. 7D illustrates the compact assembly 740 illustrated in FIG. 7C provided within an external housing for a portable electronic device according to one embodiment. The compact housing 740 fits within the internal area 609 and can be secured to one or more of the back housing portion 604 and the side housing portions 606 and 608. Thereafter, the top housing portion 602 can be provided to complete the enclosure of the internal area 609, and the resulting portable electronic device is as shown in FIG. 6.

Figure 8:
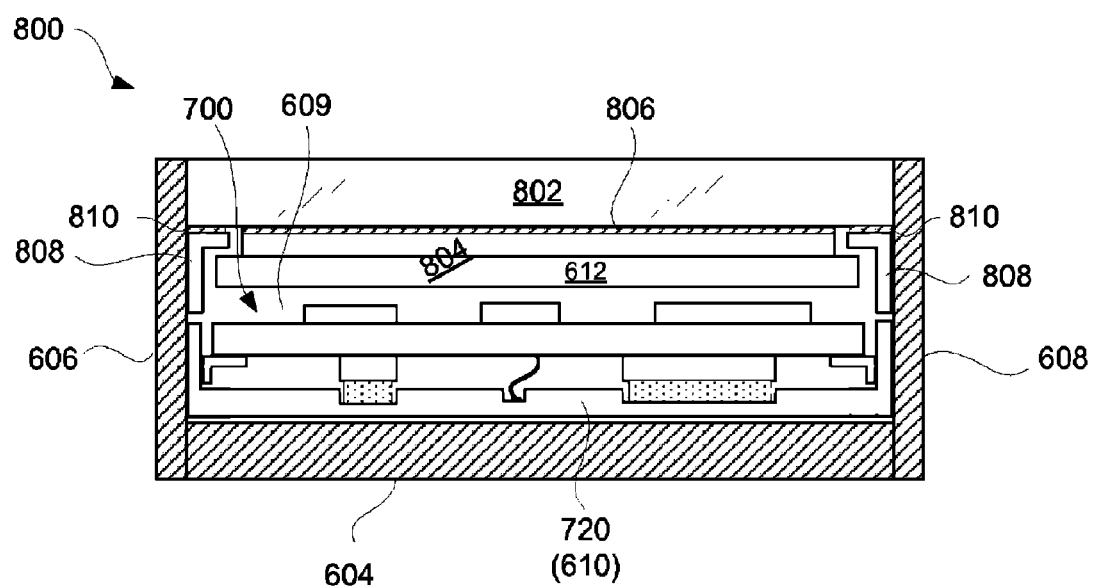
FIG. 8 is a cross-sectional view of a portable electronic device according to another embodiment.

FIG. 8 is a cross-sectional view of a portable electronic device 800 according to another embodiment. In this embodiment, the portable electronic device 800 is generally similar to the portable electronic device 600 illustrated in FIG. 6 but further includes a touch screen.

The portable electronic device 800 includes an outer housing that has a cover glass 802 which serves as a front housing portion. The outer housing also includes the back housing portion 604, the side housing portion 606 and the side housing portion 608. A display screen module 804 is provided in the internal area 609 adjacent to the cover glass 802. A peripheral adhesive layer 806 can be used at least in part to secure the display screen module 804 to the inside surface of the cover glass 802. Additionally, within the internal area 609, one or more brackets 808 can be provided to secure the cover glass 802 and/or the display screen module 804. The brackets 808 can be secured to the side housing portions 606 and 608 by any of a variety of means, and can secure the cover glass 802 thereto with an adhesive layer 810.

Internal to the outer housing for the portable electronic device 600 is the interior area 609. Various structures and electrical components can be provided within the interior area 609 to facilitate operation of the portable electronic device 800. In this embodiment, included within the internal area 609 is the multi-layer support structure 720 (610). The multi-layer support structure 720 can be formed from two or more layers that are integrally bonded together as discussed above. Of the two or more layers, at least one is primarily a support layer and at least one is primarily a conductivity layer. Also included within the internal area 609 is the sub-assembly 700 which includes the substrate 612 and the electrical components. As illustrated in FIG. 8, within the internal area 609, the sub-assembly 700 is placed over or adjacent the multi-layer support structure 720. Additionally, to facilitate conductivity between certain electrical components mounted on the substrate 612, the multi-layer support structure 720 can include openings (e.g., 624, 626 and 628) that effectively expose the bottom or internal layer (e.g., conductivity layer) which offers enhanced conductivity as compared to the top layer (e.g., support layer). As illustrated in FIG. 8, the placement of the opening can correspond to and be positioned adjacent the electrical components mounted on the bottom side of the substrate 612.

Additionally, a compliant material, which is also conductive, can be placed between the electrical components and the openings. Hence, the arrangement of the electrical components and the opening (as well as the placement of the compliant material or conductor) can establish a high conductivity path from the electrical component to the bottom or internal layer (e.g., conductivity layer) of the multi-layer support structure 720.

Figure 9:
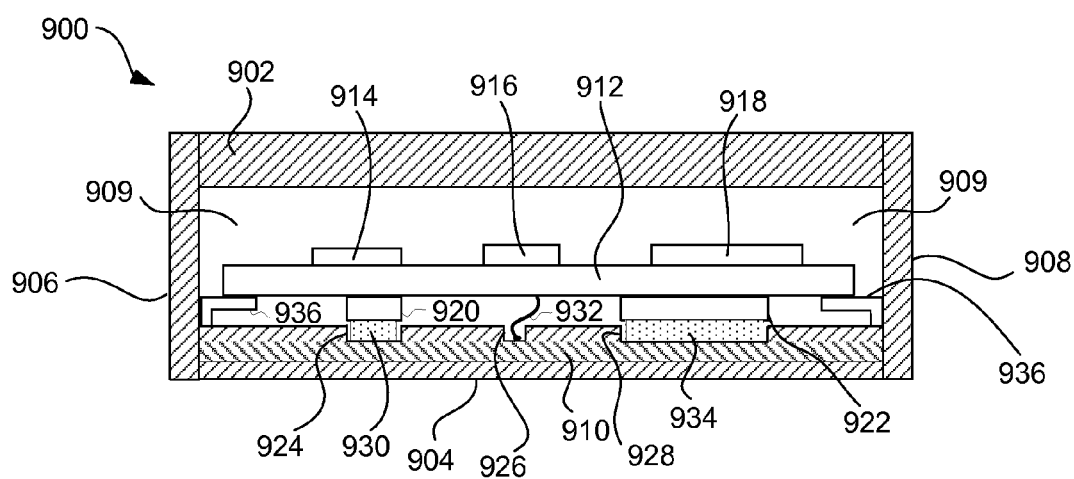
FIG. 9 is a cross-sectional view of a portable electronic device according to another embodiment.

FIG. 9 is a cross-sectional view of a portable electronic device 900 according to another embodiment. The portable electronic device 900 includes an outer housing that has a front housing portion 902, a back housing portion 904, a side housing portion 906 and a side housing portion 908.

Internal to the outer housing for the portable electronic device 900 is an interior area 909. Various structures and electrical components can be provided within the interior area 909 to facilitate operation of the portable electronic device 900. In this embodiment, the back housing portion 904 of the outer housing is a multi-layer structure having an internal high conductivity layer 910. The multi-layer support structure can be formed from three layers that are integrally bonded together. Of the three layers, first and third layers are primarily for support and second layer is primarily for enhanced conductivity (i.e., the internal high conductivity layer 910). Also included within the internal area 909 is a substrate 912. The substrate 912 supports electrical interconnections with a plurality of electrical components, including electrical components 914, 916, 918, 920 and 922. As illustrated in FIG. 9, the electrical components 914, 916 and 918 are provided on a top side of the substrate 912, while the electrical components 920 and 922 are provided on a bottom side of the substrate 912.

As arranged within the internal area 909, the substrate 912 is placed over or adjacent the multi-layer support structure. Additionally, to facilitate conductivity between certain electrical components mounted on the substrate 912, the multi-layer support structure can include openings 924, 926 and 928 in the first layer (e.g., support layer) that effectively expose the second (internal) layer (e.g., conductivity layer) which offers enhanced conductivity as compared to the first layer. As illustrated in FIG. 9, the placement of the openings 924, 926 and 928 in the first layer of the multi-layer support structure can correspond to and be positioned adjacent the electrical components mounted on the bottom side of the substrate 912.

In particular, the electrical component 920 can be provided adjacent the opening 924. Additionally, a compliant material 930, which is also conductive, can be placed between the electrical component 920 and the opening 924. Hence, the arrangement of the electrical component 920 and the opening 924 (as well as the placement of the compliant material 930) establishes a high conductivity path from the electrical component 920 to the second layer (e.g., conductivity layer) of the multi-layer support structure. A conductor 932, such as a wire) can be coupled between the substrate 912 (or electrical component(s) thereon) to the second layer (e.g., conductivity layer) of the multi-layer support structure so as to provide electrical coupling therebetween. The electrical component 922 can be provided adjacent the opening 928. Additionally, a compliant material 934, which is also typically conductive, can be placed between the electrical component 922 and the opening 928. Hence, the arrangement of the electrical component 922 and the opening 928 (as well as the placement of the compliant material 934) establishes a high conductivity path from the electrical component 922 to the second layer (e.g., conductivity layer) of the multi-layer support structure.

Accordingly, in the embodiment illustrated in FIG. 9, the conductor 932 is provided to render an electrical connection between the substrate 912 and the second layer of the multi-layer support structure 910, and the opening 924 and 928 (along with the compliant material 930 and 934) are utilized to provide thermal coupling between the electrical components 920 and 922 and the second layer of the multi-layer support structure 910 which offers high thermal conductivity. Still further, within the internal area 909, one or more brackets 936 can be provided to secure the substrate 912 relative to the multi-layer support structure.

Although the embodiments discussed above utilize a multi-layer support structure in which and internal layer provides height conductivity, it should be understood that the multi-layer support structure could utilize multiple distinct layers of conductivity, such as for different voltage potentials. For example, in a five layer support structure, the first and fifth layers could be primarily for support, the third layer could be for support and/or isolation, and the second and fourth layers could be primarily for conductivity. Additionally, the second and fourth players could be electrically isolated, such as by the third layer.

Still further, in other embodiments, it should be understood that the high conductivity layer within a multiple-layer support structure could be manufactured to have a pattern, shape, etc. or otherwise not consume an entire layer. For example, in a given height content to the layer, there could be two or more isolated regions of conductivity. For purposes of electrical conductivity, the use of distinct isolated conductivity regions can permit different voltage potentials to reside within a given height conductivity layer.

As used herein, an electrical device can pertain to a wide variety of products, including consumer electronic devices. The electronic devices can include televisions, computing devices, including computers (e.g., desktop, notebook, tablet, etc.), mobile telephones, game players, remote controllers, media players and various other devices.

The various aspects, features, embodiments or implementations of the invention described above can be used alone or in various combinations.

Although only a few embodiments of the invention have been described, it should be understood that the invention may be embodied in many other specific forms without departing from the spirit or the scope of the present invention. By way of example, the steps associated with the methods of the invention may vary widely. Steps may be added, removed, altered, combined, and reordered without departing from the spirit of the scope of the invention. Similarly, while operations are depicted in the drawings in a particular order, this should not be understood as requiring that such operations be performed in the particular order shown or in sequential order, or that all illustrated operations be performed, to achieve desirable results.

While this specification contains many specifics, these should not be construed as limitations on the scope of the disclosure or of what may be claimed, but rather as descriptions of features specific to particular embodiment of the disclosure. Certain features that are described in the context of separate embodiments can also be implemented in combination. Conversely, various features that are described in the context of a single embodiment can also be implemented in multiple embodiments separately or in any suitable subcombination. Moreover, although features may be described above as acting in certain combinations, one or more features from a claimed combination can in some cases be excised from the combination, and the claimed combination may be directed to a subcombination or variation of a subcombination.

While this invention has been described in terms of several embodiments, there are alterations, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A portable electronic device, comprising:
   an outer housing;
   an internal support structure provided within the outer housing, the internal support structure being a multi-layered structure having at least (i) a first layer formed of a first material that primarily provides rigidity to the multi-layered structure, and (ii) a second layer formed of a second material that provides for enhanced conductivity as compared to conductivity of the first material, the second material being different than the first material; and
   at least one electrical component provided within the outer housing, the at least one electrical component being thermally and/or electrically coupled to the second layer of the internal support structure,
   wherein the first material comprises metal, and the second material comprises metal,
   wherein the second layer has greater conductivity than the first layer, and wherein the first layer has greater rigidity than the second layer, and
   wherein the first layer of the multi-layer structure has at least one opening proximate to the at least one electrical component provided within the housing, the at least one opening exposing the second layer of the multi-layer structure.

2. A portable electronic device as recited in claim 1, wherein the electrical component comprises an integrated circuit chip.

3. A portable electronic device as recited in claim 1, wherein the electrical component is mounted on a circuit board.

4. A portable electronic device as recited in claim 1, wherein the electrical component comprises an integrated circuit chip, and wherein the integrated circuit chip is thermally and/or electrically coupled to the second layer of the internal support structure via the at least one opening.

5. A portable electronic device as recited in claim 1, wherein the at least one electrical component is provided adjacent the first layer of the multi-layered structure.

6. A portable electronic device as recited in claim 1, wherein the thickness of the internal support structure is less than about 1 mm.

7. A portable electronic device as recited in claim 1, wherein at least one portion of the second layer at the multi-layer structure that is exposed by the at least one opening through the first layer of the multi-layered structure has a coating.

8. A portable electronic device as recited in claim 7, wherein the second layer is coated or plated with an anti-corrosive material.

9. A portable electronic device as recited in claim 6, wherein the at least one electrical component is thermally and/or electrically coupled to the second layer of the internal support structure via the at least one opening.

10. A portable electronic device as recited in claim 1, wherein the multi-layered structure is a multi-layered clad metal structure.

11. A portable electronic device as recited in claim 1, where the thickness of the internal support structure is less than about 1 mm.

12. A portable electronic device as recited in claim 1, wherein the second material comprises steel, and the second layer comprises copper, aluminum, silver or gold.

13. A portable electronic device as recited in claim 1, wherein the internal support structure comprises an internal chassis.

14. A portable electronic device as recited in claim 1, wherein the internal support structure comprises a frame.

15. A method for assembly of a portable electronic device, the method comprising:
    providing a multi-layer metal structure to provide support for internal components of the portable electronic device, the multi-layer metal structure including at least one structural layer and at least one highly conductive layer;
    providing heat-generating electrical components of the portable electronic device that cooperate to support functions of the portable electronic device; and
    coupling at least one of the heat generating electrical components to the at least one highly conductive layer of the multi-layered structure.

16. A method as recited in claim 15, wherein the coupling comprises electrical coupling.

17. A method as recited in claim 15, wherein the coupling comprises thermally coupling.

18. A method as recited in claim 15, wherein the coupling comprises at least one of:
    thermally coupling at least one of the heat generating electrical components to the at least one highly conductive layer; and electrically coupling at least one of the heat generating electrical components to the at least one highly conductive layer.

19. A method as recited in claim 15,
wherein the highly conductive layer serves as a ground plane for the portable electronic device, and
wherein the coupling comprises:
electrically coupling at least one of the heat generating electrical components to the at least one highly conductive layer and thus the ground plane.

20. A method as recited in claim 15, wherein the coupling at least one of the heat generating electrical components to the at least one highly conductive layer of the multi-layered structure comprises:
forming at least one opening in the at least one structural layer; and
coupling at least one of the heat generating electrical components to the at least one highly conductive layer of the multi-layered structure via the at least one opening.

21. A method as recited in claim 20, wherein the least one of the heat generating electrical components is positioned within the portable electronic device adjacent to the multi-layered structure.

22. A method as recited in claim 21, wherein the coupling comprises electrical coupling.

23. A method as recited in claim 21, wherein the coupling comprises thermally coupling.

24. A method for assembly of a portable electronic device, the method comprising:
providing a multi-layered metal structure to provide support for internal components of the portable electronic device, the multi-layer metal structure including at least a first metal layer and at least a second metal layer, the first metal layer having at least one opening that exposes the second metal layer;
providing heat-generating electrical components that cooperate to support functions of the portable electronic device;
securing at least one of the heat-generating electrical components internal to the portable electronic device and adjacent the at least one opening in the first metal layer of the multi-layer metal structure; and
thermally and/or electrically coupling the at least one of the secured heat generating electrical components to the second metal layer of the multi-layered structure via the at least one opening in the first metal layer.

25. A method as recited in claim 24, wherein the providing of the multi-layer structure comprises:
obtaining the multi-layer structure without any openings; and
forming at least one opening in the first metal layer of the multi-layer structure.

26. A method as recited in claim 24, wherein the forming of the at least one opening comprises:
etching at least one opening in the first metal layer of the multi-layer structure.

27. A method as recited in claim 24,
disposing a compliant layer of material between the at least one of the secured heat generating electrical components and the second metal layer of the multi-layered structure via the at least one opening in the first metal layer, so as to facilitate thermal coupling.

28. A method as recited in claim 24,
connecting a conductive member between the at least one of the secured heat generating electrical components and the second metal layer of the multi-layered structure via the at least one opening in the first metal layer, so as to facilitate electrical coupling therebetween.

29. A method as recited in claim 24, wherein the first metal layer comprises steel, and wherein the second metal layer comprises aluminum or copper.

30. A method as recited in claim 24, wherein the multi-layered metal structure further include a third metal layer, and wherein the second metal layer is sandwiched between the first and third metal layers of the multi-layered structure.

31. A method as recited in claim 24, wherein the second metal layer has greater conductivity than the first metal layer, and wherein the first metal layer has greater rigidity than the second metal layer.

32. A method as recited in claim 24, wherein the first metal layer is a rigid structural layer and the second metal layer is a highly conductive layer.

* * * * *